United States Patent
Helling et al.

[19]

[11] Patent Number: 5,882,415
[45] Date of Patent: Mar. 16, 1999

[54] ELECTRON-BEAM CONTINUOUS PROCESS VAPORIZATION INSTALLATION FOR THERMALLY HIGH STRESSED SUBSTRATA

[75] Inventors: Karl Heinz Helling, Schonfeld-WeiBig; Bernd-Dieter Wenzel, Dresden, both of Germany

[73] Assignee: Von Ardenne Anlagentechnik GmbH, Dresden, Germany

[21] Appl. No.: 725,814

[22] Filed: Oct. 7, 1996

[30] Foreign Application Priority Data

Oct. 5, 1995 [DE] Germany .................. 195 37 092.9

[51] Int. Cl.$^6$ ............................ C23C 16/00; C23C 14/00
[52] U.S. Cl. ........................ 118/723 EB; 118/723 VE; 118/719
[58] Field of Search ................ 118/719, 723 EB, 118/723 VE; 204/298.25

[56] References Cited

U.S. PATENT DOCUMENTS

| | | | |
|---|---|---|---|
| 3,294,670 | 12/1966 | Charschan et al. | 118/719 |
| 3,656,454 | 4/1972 | Schrader | 118/49 |
| 4,358,472 | 11/1982 | Small et al. | 427/10 |
| 4,663,009 | 5/1987 | Bloomquist et al. | 204/192.2 |
| 4,894,133 | 1/1990 | Hedgcoth | 204/192.15 |
| 5,490,910 | 2/1996 | Nelson et al. | 204/192.15 |
| 5,538,610 | 7/1996 | Gesche et al. | 204/298.15 |
| 5,630,879 | 5/1997 | Eichmann et al. | 118/720 |
| 5,651,868 | 7/1997 | Canady et al. | 204/298.25 |
| 5,702,533 | 12/1997 | Mundt et al. | 118/733 |

*Primary Examiner*—R. Bruce Breneman
*Assistant Examiner*—Jeffrie R. Lund
*Attorney, Agent, or Firm*—Nolte, Nolte & Hunter

[57] ABSTRACT

The invention is an electron-beam vaporization installation for coating structural components made of extreme-heat-resistant alloys (super alloys), especially turbine blades, with so-called thermal barrier coatings. The invention divides the continuous process principle for this coating task with extreme thermal stress for the substrata. The invention divides the thermally high stressed chambers by a partition with a slot. As a result of this the heating chamber and the coating chamber are thermally decoupled from the room for the transport system of the substrata carriage. A further characteristic of the invention is that the carriage for the transport of the substrata through the installation is cooled. For this purpose at the specific work positions the cooling system of the carriage is coupled with the exterior cooling circuits by a leakproof coupling system. The movement of the substrata is done hydraulically and is coupled with the exterior hydraulic circuits in a similar manner as the cooling system. The hydraulic medium is used also for cooling of the drive system. Diffusion pump oil is used as medium in all circuits to further reduce the possibility of affecting the residual gas.

5 Claims, 2 Drawing Sheets

ELECTRON-BEAM CONTINUOUS PROCESS VAPORIZATION INSTALLATION FOR THERMALLY HIGH STRESSED SUBSTRATA

CROSS REFERENCES TO RELATED APPLICATIONS

Priority is claimed from German application, Serial No. 195 37 092.9-45, filed 5 Oct. 1995, under 35 USC 119.

STATEMENT AS TO RIGHTS TO INVENTION MADE UNDER FEDERALLY SPONSORED RESEARCH AND DEVELOPMENT

None.

BACKGROUND OF THE INVENTION

1. Field of the Invention

The invention relates to an electron-beam vaporization installation for coating structural components made of extreme-heat-resistant alloy (super alloys), especially turbine blades, with thermal barrier coatings (TBC). The protective coatings permit higher operating temperatures for thermal engines result in a higher thermal efficiency. The design of the installation permits a productive coating of the substrata by a continuous process.

2. Description of Related Art, Including Information Disclosed Under 37 CFR 1.97–1.99.

Known prior installations for coating TBC use a batch operation process and consist primarily of charging chamber, heating chamber, vaporization chamber with linearly arranged vaporizer crucibles, transport installation for the substrata, electron gun, associated evacuation equipment and the necessary peripheral components. To obtain the necessary adhesive strength of the layers the structural components are preheated to temperatures above 1000° C. Furthermore, during the vaporization the structural components have to be moved over the vapor source in order to obtain an as uniform as possible thickness of the layer. Because of the high process temperatures the chambers are water cooled and can be separated by valves also water cooled. Therefore, a ventilation of the heating and the vaporization chambers is not required. While the valve between the charging chamber and the heating chamber is absolutely necessary, the valve between the heating chamber and the vaporization chamber is only needed, when the vaporization chamber has to be opened for maintenance or for an exchange of the vaporizing material, or when during a reactivating coating the entrance of oxygen into the heating chamber is temporarily to be limited.

A carriage with a changing pole of a corresponding length is used for the transport of the substrata through the chambers. The charging pole has at the equipment end the mechanics for a substratum holder, making possible also the turning and swiveling of the substratum and the eventual installation of cooling water and sensor conduits. By using exchangeable substratum holders the simultaneous coating of several smaller substrata is made possible. Normally the other end of the charging pole is installed rotatably in a carriage. The long charging pole, above to withstand thermal stress or water cooled, permits the transport of the substrata inside or through the hot zones, without the carriage with its drive is being exposed to the extremely high temperatures.

In smaller installations this carriage is mostly located in the atmosphere and the water cooled charging pole reaches through a rotary and sliding transit into the installation. While this allows a shorter charging chamber and a smaller volume of the installation, the cost, however, the cost for the calibrated pole and the sliding rotary transit is high.

On the other hand in large installations the carriage runs mostly in the charging chamber which can be evacuated. This has the advantage that there are no special requirements for the surface condition of the charging pole. Instead of the expensive rotary and sliding transits, only rotary transit for inside spindles are needed. These transport the carriage and transfer to it the rotation and swivel movements. With this solution the horizontal drive does not have to absorb the large forces due to air pressure, on the charging pole. The disadvantages, of both of these embodiments with charging pole, are their lack of flexibility. If in the course of technological development it becomes necessary to install additional processing chambers or work stations then the charging pole would have to be lengthened accordingly. There are, however, limits to such a lengthening due to the diminishing stiffness for a given cross-section. In addition, each lengthening of the chamber entails the double lengthening of the installation. But even without this aspect the prior known designs have disadvantages because of the high construction costs, their great length, and the corresponding large space requirement of the installation and therewith large costs.

There is also the possibility to mount the substratum receiver directly at the transport carriage without using a charging pole. The transport carriage is then moved inside the chambers by a cooled roller system. This solution has the disadvantage that for the thermal shielding of the carriage an additional intermediate chamber has to be installed, between the heating chamber and the coating chamber, in which the transport carriage is located during the coating.

The common disadvantages of the described designs are that because of the charge process in which work pieces are treated together within the heating chamber. The work pieces are positioned on a carrier until it is filled. Then the carrier is placed in a preheating chamber where work pieces are heated together to the given temperature. Then the carrier is transported to the vaporization chamber operation. The time for a vaporizing cycle consists of the sum of the process times at the individual stations of the installation. For a partial solution of this problem the chambers for performing the auxiliary processes "vacuum passing lock" and "preheating" were arranged mirror-inverted on both sides of the vaporizing chamber and two or four mechanisms are used for the substrata transport. Such installations are equipped, for instance, with four movable charging chambers and four heating chambers. This solution, therefore, is very expensive in space and costs.

Using an installation working according to the continuous processing principle would solve the problems mentioned. The prior known transport systems, however, cannot be employed for the solution of the coating problem at hand because of the extreme high thermal stresses in the heating the coating chambers.

SUMMARY OF THE INVENTION

The task is to develop a design which allows to employ the principle of continuous operation of successive transport of the substrata through the chambers of the installation also at the very high thermal stresses in the heating and coating chambers.

According to the invention this task is solved by subdividing the chambers with a high thermal stress by a partition into two separated sectional chambers where one of the sectional chambers takes in the transport carriage and the other sectional chamber the substratum holder with the turbine blades. These two sectional chambers communicate through a slot in the partition extending in the direction of the transport. Through this slot the connecting elements between the transport carriage and the substratum holder reach through. Furthermore, a shield can be installed at the transport carriage that covers the slot except for the opening necessary for the substratum holder. The heating elements and vaporization station are located in that section of the chamber through which the substrata pass through. On the other hand the transport carriage moves in the section of the particular chamber that is subjected to only slight thermal stress and in which the transport devices for the carriage are arranged. Using transit valves located between the chambers these can be separated vacuum-wise from one another in the continuous process installations usual manner.

Another significant characteristic of the solution according to the invention is that a hydraulic drive is used for the necessary rotational and swivel movements of the substrata. This kind of drive has the advantage that the medium can be used at the same time for cooling. In addition to the hydraulic circuits one or several cooling circuits are installed in the carriage. An appropriate dimensioning of these cooling circuits assures that the allowable temperature limit is not exceeded at any section of the transport system. The cooling of the carriage is absolutely necessary for this embodiment because the small distance between the carriage and the substratum makes an effective thermal decoupling almost impossible.

To implement the solution according to the invention it is necessary that the drive and cooling system of the carriage comprising several circuits in the particular work positions in the heating chamber or the vaporization chamber is coupled under vacuum through a leakproof coupling system with the medium connections brought in from the outside. This is possible with state of the art coupling systems. With such systems only the immediate disconnecting point is still covered by a thin film of the medium after the separation. Diffusion pump oil is used as medium for hydraulic and cooling. As a result the residual gas ratio is not affected and an effective cooling is obtained, All chambers are accessible for service and maintenance by doors or covers.

The horizontal transport and guidance of the carriage are effected in the known way by synchronically driven rollers arranged in all chambers. In the chambers with partition these rollers are located in the "cold" section.

The solution according to the invention allows the coating of turbine blades according to the continuous process principle. Thus such advantages of this type of installation as: parallel operating sequence of passing through the input lock, heating, coating, cooling and passing through the output lock, and continuous sequence of operation, can also be utilized for this complicated coating problem.

DESCRIPTION OF THE PREFERRED EMBODIMENTS

Figure 1:
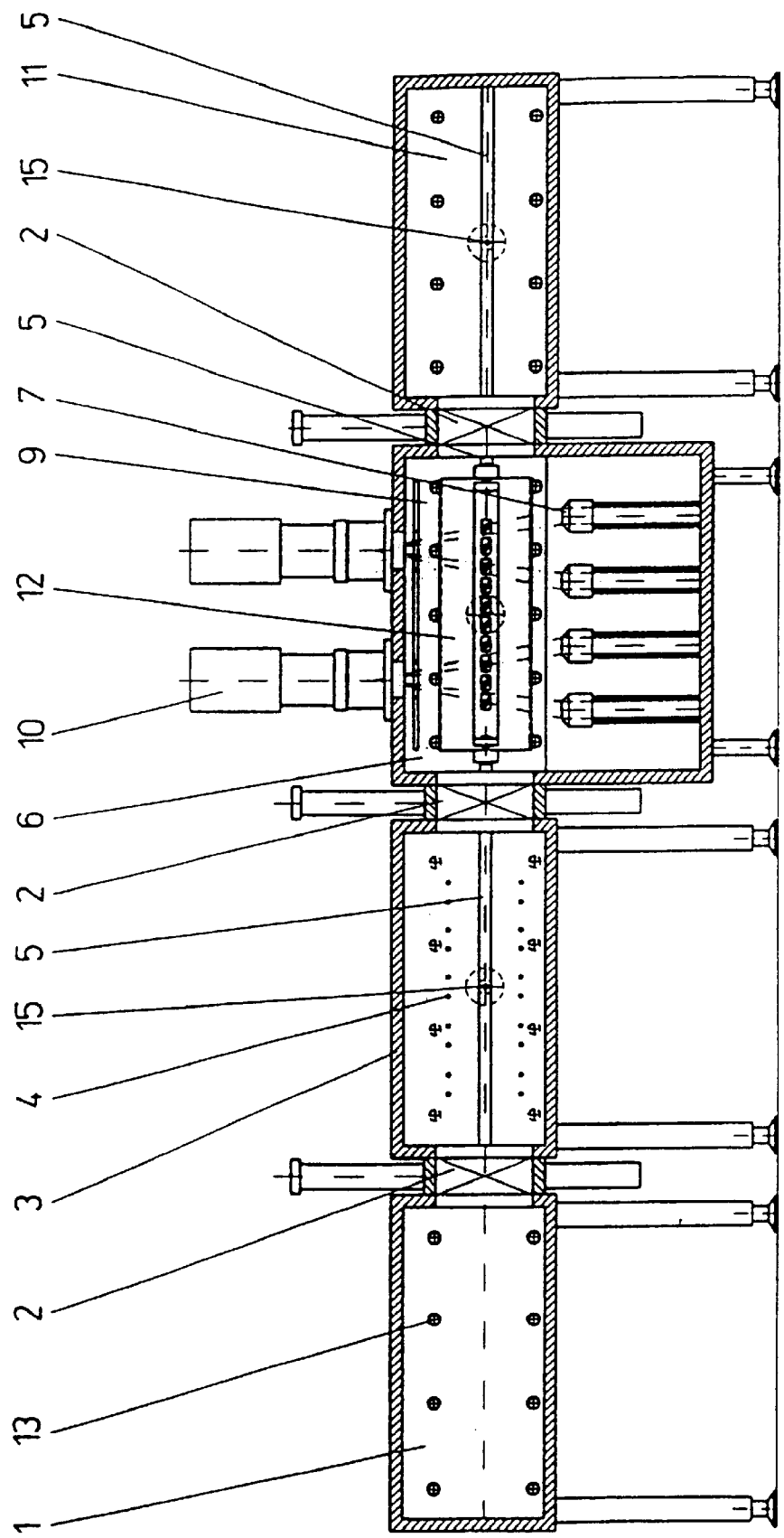
FIG. 1 is an elevation in section of the invention.
Figure 2:
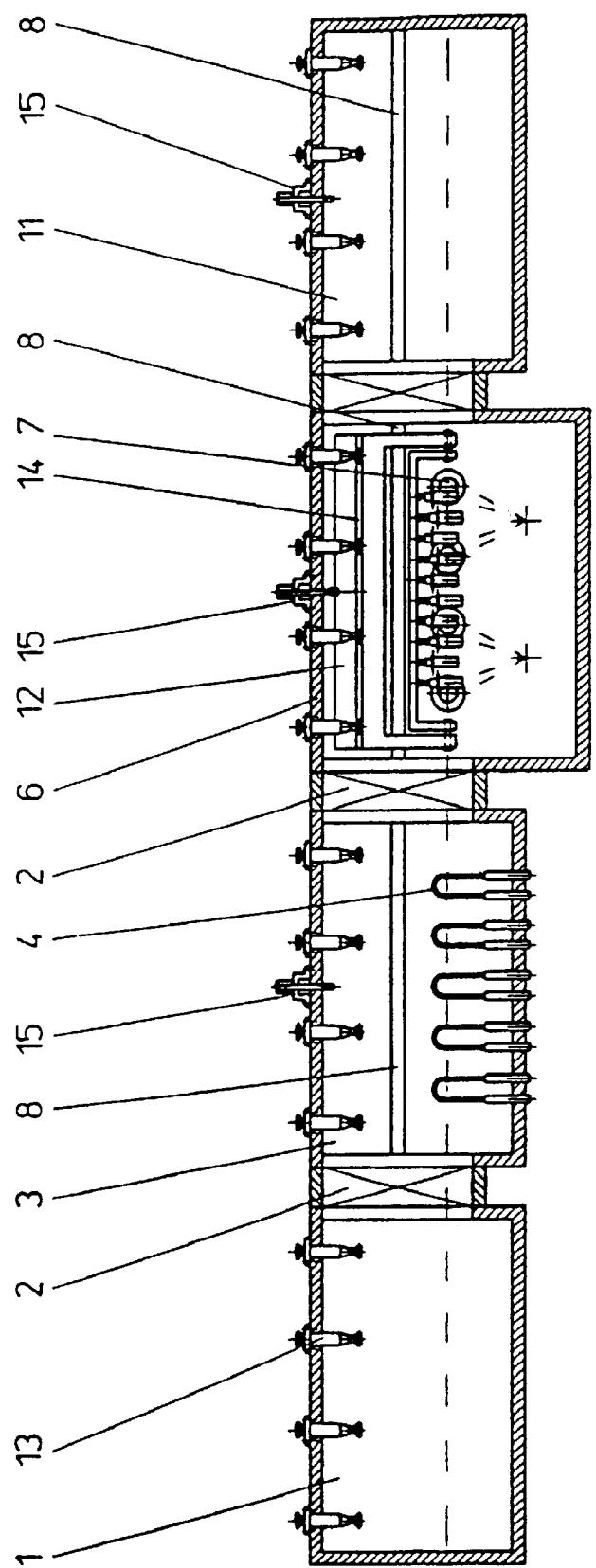
FIG. 2 is a plan view in section of the installation.

In the following, the invention will be described more in detail using an exemplified embodiment. FIG. 1 shows a vertical section and FIG. 2 a horizontal section of the installation. A lock chamber 1 equipped with a corresponding evacuation equipment is connected separated by a water cooled transit valve 2, with a heating chamber 3 with a radiation heater 4. The heating chamber 3 is divided parallel to the direction of transport by a vertical water cooled partition 8 with a horizontal slot 5. In transport direction another water cooled transit valve 2 is installed at the heating chamber 3. This transit valve connects with the vaporization chamber 6 that is also water cooled and provided with a corresponding evacuation equipment and one or several vaporizer crucibles 7, a condensate receiver 9, and one or more electron guns 10. The vaporization chamber 6 is also subdivided into two sectional chambers by a partition 8 with a horizontal slot 5. Through another water cooled transit valve 2 and after a cooling phase in the discharge lock 11, which is water cooled and filled with inert gas, the carriage 12 can be discharged from the installation. The discharge lock, like the chambers 3 and 6, is provided with a partition 8 with slot 5. All chambers are equipped with doors or covers for maintenance and service.

In the entrance lock, those sections of heating chamber 3 and vaporization chamber 6, in which neither heating elements nor coating equipment are located, and in the discharge lock series of rollers 13 are arranged on both side of the carriage 12. On these rollers 13, the carriage 12 runs equipped with corresponding guide rails 14. With the transit valve 2 opened, the driving system enables: the transport of the carriage 12 from one into the next chamber, and then the moving in of another carriage from the previous chamber.

At the heating chamber 3, the vaporization chamber 6, and the discharge lock, each, is located a multichannel coupling system 15. In the specific work position of the carriage 12 these systems perform the coupling of the hydraulic and cooling circuits to the cooling circuits and the hydraulic drive systems in the carriage 12 for the movement of the substrata.

We claim:

1. An electron-beam vaporization installation for coating structural components made of extreme-heat-resistant alloys (super alloys), for the application of thermal barrier coats (TBC), said installation comprising lock chambers, a heating chamber, a vaporization chamber with electron beam vaporizers and vaporizer crucibles, transit valves, transport arrangements for a substrata, an associated evacuation installation;

wherein the heating chamber (2), the vaporization chamber (6), and a discharge lock (11) used simultaneously as a cooling chamber, are each subdivided in a direction of the transport of the substrata by a partition (8) into two sectional chambers only communicating through a slot (5) through which connecting elements between a transport carriage (12) and a substratum holder reach through, wherein heating elements and a vaporization station are installed in a section of the particular chamber which is traversed by the substrata while the transport carriage (12) is moved in an other section of the particular chamber (2; 6; 11) which other section is subjected to less thermal stress, than the substrata, and in which also transport facilities for the transport carriage (12) are arranged, and wherein the transport carriage (12) has one or several cooling circuits which, in the heating and coating chambers (2; 6) and also the discharge lock chamber (11), can be connected at work positions with the external circuits by a leakproof coupling system (15).

2. Electron-beam vaporization installation of claim 1, wherein a drive for the rotational and swivel movement of the substrata is effected hydraulically, and hydraulic circuits at the work positions of the transport carriage (12) are connected by a leakproof coupling system.

3. Electron-beam vaporization installation of claim 2 wherein diffusion pump oil is used as a medium for the hydraulic drive and for cooling.

4. Electron-beam vaporization installation of claim 2 wherein a medium for the hydraulic drive is also used for cooling of the transport carriage (12) and a drive system for the substrata.

5. Electron-beam vaporization installation of claim 1, wherein on the transport carriage a shield is mounted which, at the work position, covers the slot (5) in the partition of the heating chamber, the coating chamber, and the cooling/discharge lock chamber (2; 6; 11) except for a necessary opening for the substrata holder.

* * * * *